United States Patent [19]
Pennisi et al.

[11] Patent Number: 5,136,365
[45] Date of Patent: Aug. 4, 1992

[54] ANISOTROPIC CONDUCTIVE ADHESIVE AND ENCAPSULANT MATERIAL

[75] Inventors: Robert W. Pennisi, Boca Raton; Marc V. Papageorge, Plantation; Glenn F. Urbish, Coral Springs, all of Fla.

[73] Assignee: Motorola, Inc., Schaumburg, Ill.

[21] Appl. No.: 588,889

[22] Filed: Sep. 27, 1990

[51] Int. Cl.⁵ ............................................. H01L 23/28
[52] U.S. Cl. ....................................... 357/72; 357/80; 357/81; 148/24; 148/25; 252/511; 252/514
[58] Field of Search ............... 357/81, 72, 80; 148/24, 148/25; 252/511, 514

[56] References Cited
U.S. PATENT DOCUMENTS

| | | | |
|---|---|---|---|
| 4,578,215 | 3/1986 | Bradley | 252/511 |
| 4,595,606 | 6/1986 | St. John et al. | 252/514 |
| 4,604,644 | 8/1986 | Beckham et al. | 357/80 |
| 4,680,141 | 7/1987 | Barajas | 252/512 |
| 4,747,968 | 5/1988 | Gilleo | 252/514 |
| 4,789,411 | 12/1988 | Eguchi et al. | 148/24 |

OTHER PUBLICATIONS

Lee, H. et al., *Epoxy Resins—Their Applications and Technology*, McGraw-Hill, 1957, pp. 230–231.
Gabrykewicz, Sangupta, Thuruthumely and Frazee, "Glob top Material Selection for Flip Chip Devices", Proceedings of the 1986 International Symposium for Microelectronics, 1986, pp. 707–713.

*Primary Examiner*—Andrew J. James
*Assistant Examiner*—Sara W. Crane
*Attorney, Agent, or Firm*—Daniel K. Nichols; Dale W. Dorinski

[57] ABSTRACT

An adhesive material 220 including a fluxing agent and metal particles 240 is applied to either a substrate 200 having a metallization pattern 210 or an electrical component 230. The component 230 is positioned on the substrate 210 and heated. During the heating step, the fluxing agent promotes adhesion of the metal particles 240 to the substrate metallization pattern 210 and the component, and the adhesive material 220 is cured, to mechanically interconnect and encapsulate the substrate 210 and the component 230.

19 Claims, 1 Drawing Sheet

ANISOTROPIC CONDUCTIVE ADHESIVE AND ENCAPSULANT MATERIAL

TECHNICAL FIELD

This invention relates generally to electronic circuitry, and more particularly to electrical interconnection methods, and most particularly to flip chip attachment and encapsulation of integrated circuits.

BACKGROUND

The solder bump interconnection was developed to eliminate the expense, unreliability, and low productivity of manual wire bonding. Solder bump interconnection technology for flip chip integrated circuits has been practiced in one form or another for approximately 20 years. Whereas the initial, low complexity integrated circuits typically had peripheral contacts, the flip chip bumping technology has allowed considerable increase in interconnect density as it progressed to full population area arrays. The controlled collapse chip connection utilizes solder bumps deposited on wettable metal terminals on the die and a matching footprint of solder wettable terminals on the substrate. The upside down integrated circuit (flip chip) is aligned to the substrate and all joints are made simultaneously by reflowing the solder. In the controlled collapse method, a bump of solder is deposited on the terminals of the integrated circuit. Numerous schemes to deposit a precisely formed solder bump on the die surface have been the subject of intense efforts over many years, with each solution to the problem having significant drawbacks. Even the best methods add substantial costs and processing steps to the die.

The solder bump is restrained from flowing out on the terminals by using thick film glass dams, limiting solder flow to the tip of the substrate metallization. Similarly, the flow of solder on the integrated circuit is limited by the size of the solderable pad on metal exposed in the covering surface of chemically vapor deposited glass passivation on the integrated circuit.

Selection of the solder alloy has been defined on the basis of melting point. High lead solders have been used when bonding the integrated circuit to alumina ceramic substrates because of the high melting point of the alloy, allowing further processing of the assembled circuit. Joining to organic carriers such as epoxy or polyimide circuit boards requires lower melting solder alloys. Solders such as eutectic tin/lead solder (melting point 183° C.) or lead/indium solder (melting point 220° C.) have been used.

The choice of terminal metallurgy depends on the solder selected. Silver and gold are poor choices since they rapidly dissolve in the solder. Thus, copper, tin, lead, palladium, platinum, or nickel are commonly used for the circuit board terminals, and chrome, titanium, or nickel thin films are commonly used for the integrated circuit terminal.

To join the integrated circuit to the substrate, a flux, either water-white rosin or water soluble flux, is placed on the substrate as a temporary adhesive to hold the integrated circuit in place. The assembly is subjected to a reflow thermal cycle, joining the die to the substrate in an oven or furnace. The surface tension of the solder aids to self align the die to the substrate terminals. After reflow, the flux residue must be removed in order to prevent corrosion of the die. Materials such as chlorinated, fluorinated or hydrocarbon solvents are used to remove the rosin, or water with surfactants is used to remove a water soluble flux. Due to the close proximity of the die to the substrate (typically 0.001 to 0.004 inches), removing the flux residue from under the die is a difficult operation requiring sophisticated cleaning regimes and a significant expenditure of time. Insuring complete removal of all flux residue has been the subject of much effort in the industry.

After cleaning, the assembly is electrically tested, and further packaging is added to provide environmental protection. Passivation, encapsulation, or addition of a cover are the usual methods. In the case of encapsulation, a liquid polymer is applied around and under the die. Historically, the polymers of choice have been silicones and epoxies, with epoxies finding greater favor. The adhesion of epoxies to a ceramic substrate is superior to silicones. The expansion coefficient of epoxies can be lowered with the addition of ceramic fillers. This reduces thermal stresses that develop between the substrate and the encapsulant. The importance of epoxy adhesives with low expansion coefficients cannot be over emphasized for flip chip applications. Cured epoxies are hard and do not posses the flexibility of silicones. Thus, if their expansion coefficients are not lowered with fillers, early device failure can result from crack formation in the die. The use of inorganic fillers also affects thermal conductivity and the level of ionic contaminants.

The very small gap between the die and the substrate must be completely filled in order to provide maximum environmental protection for the device. Previous efforts to seal the device left a voided area in the center of the die, as described in U.S. Pat. No. 4,604,644, where an organic resin is applied around the periphery of the die, and drawn into the space by capillary action. As the size of dies increase, the limiting effect of capillary action becomes more critical and leaves an even greater area of the die unprotected.

Other methods of encapsulating the die surface have attempted to overcome the above limitations by applying the organic resin through a hole in the substrate, located at the center of the die. After the soldering and cleaning operations, the encapsulating resin is applied through the hole and also around the periphery of the die, to insure complete coverage of the die surface. This method suffers from the need to reserve an area in the substrate that is free of circuitry, in order to provide a unused space for the hole.

Clearly, an improved method of encapsulating flip chip integrated circuits that eliminates solder bumping, insures complete coverage of the die surface, and allows maximum use of the available area of the substrate is needed.

SUMMARY OF THE INVENTION

Briefly, according to the invention, an adhesive material containing a fluxing agent and solder particles is applied to either a substrate having a metallization pattern or an electrical component. The component is positioned on the substrate and the adhesive is heated. During the heating step, the fluxing agent promotes adhesion of the solder particles to the substrate metallization pattern and the component, and the adhesive material is cured, to mechanically interconnect, encapsulate, and passivate the substrate and the component.

DETAILED DESCRIPTION OF THE PREFERRED EMBODIMENT

Figure 1:
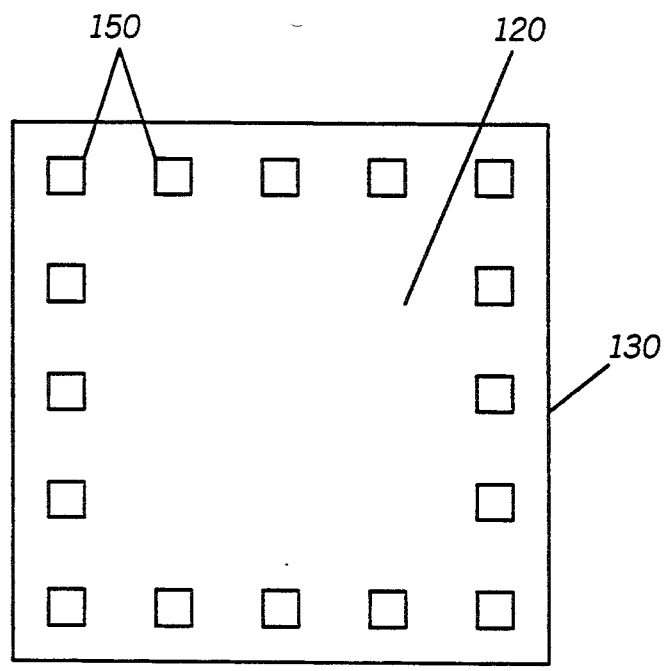
FIG. 1 is a plan view of a device coated with the adhesive material.
Figure 2:
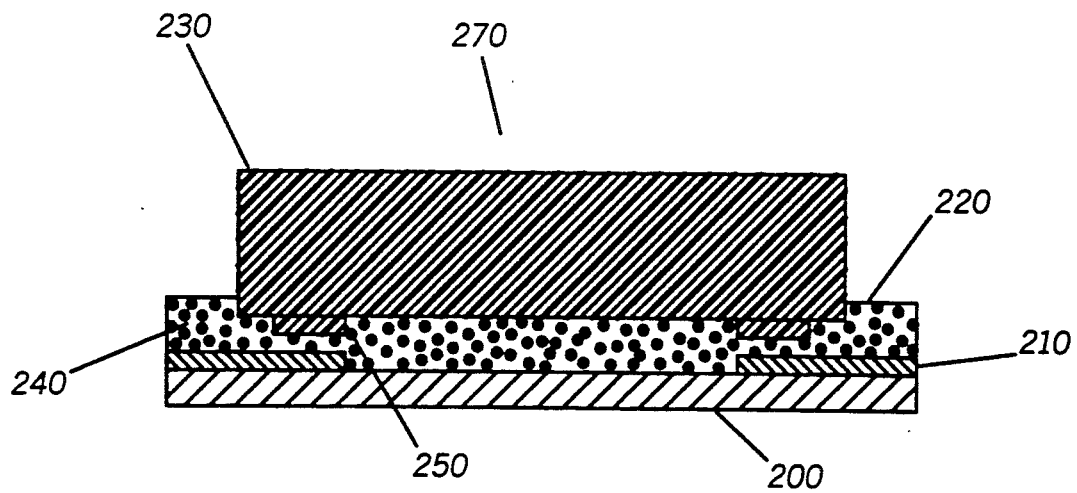
FIG. 2 is a sectioned elevational view of a device after attachment to a substrate.

Referring to FIG. 1, an integrated circuit die 130 having electrical terminations 150 is coated with an adhesive material 120 containing a fluxing agent, a curing agent, and metal particles. The adhesive material is uniformly spread across the surface of the die, covering both the electrical terminations and the remainder of the die. Referring to FIG. 2, the adhesive material 220 is formulated to contain a fluxing agent (not shown), a curing agent (not shown), and metal particles 240 so that the adhesive material does not cure immediately at room temperature. An example of a suitable adhesive material is an epoxy resin made from bisphenol A and epichlorohydrin. Such epoxy resins are commercially available, for example, under the trade name of Epon 825 from Shell Chemical Co. of Houston, TX, and DER 332 from Dow Chemical of Midland, MI. The curing agent or hardener may be an amine, an anhydride, or other suitable reactant. Other two part resin systems such as polyester resins with suitable hardeners are also interchangeable. The purpose of the fluxing agent is to provide fluxing action for the metal particles 240. Abietic acid, adipic acid, ascorbic acid, acrylic acid, citric acid, 2-furoic acid, malic acid, and polyacrylic acid were found to be useful as fluxing agents. Other organic acids of the general formula

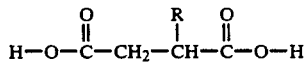

where R is an electron withdrawing group may also be useful. Specific electron withdrawing groups may be fluorine, chlorine, bromine, iodine, sulfur, nitrile, hydroxyl, benzyl or some other electron withdrawing group. The amount of the fluxing agent present in the adhesive material may range from about 0.1 to about 16 weight %, depending on the activity of the particular fluxing agent, the metal alloy selected, and the substrate metallization system. The amount of metal particles used may range from about 50 to about 85 weight % of the adhesive. The shape of the particles is preferably spherical, ranging in size from about 1 to about 20 microns in diameter. Suitable metals used for the metal particles are tin, lead, indium, bismuth, antimony, silver, or alloys of the above metals.

A device 230 is positioned so that the electrical terminations 250 are facing the substrate 200 and aligned with the metallization pattern 210 of the substrate 200. The device 230 is moved into intimate contact with the metallization pattern 210. The adhesive 220 provides a continuous seal between the device 230 and the substrate 200 to protect the device surface from environmental contamination.

It should be appreciated that although the drawings depict an integrated circuit device 230 encapsulated and connected to a substrate, embodiments using other types of surface mounted components are within the scope of the invention.

The assembly 270 is heated to cure the adhesive, causing the fluxing agent to become activated and reducing the oxides on the metal particles 240 and the metallization surface 210, permitting alloying of the metal particles to the metal terminations 250 and the substrate metallization 210. During the heating process, the adhesive shrinks and exerts pressure on the substrate-metal particle-device termination interfaces. Depending on the particular chemistry of the adhesive system, a second post curing operation may be required to completely cure the adhesive 220. During the reflow/curing step, the device is encapsulated. Since the adhesive 220 provides a continuous seal between the device 230 and the substrate 200 to protect the device surface from environmental contamination, no further cleaning or encapsulating operations are required.

The following examples serve to illustrate modes of practicing the invention and are not intended to unduly limit the claims thereof.

EXAMPLE 1

An adhesive material containing a fluxing agent and hardener was prepared according to the following formula:

| Component | % by Weight |
| --- | --- |
| Furane 89303 epoxy, Part A | 17 |
| Malic acid | 6 |
| Furane 89303 epoxy, Part B | 17 |
| Solder spheres, 200-325 mesh | 60 |

Furane 89303 epoxy, Part A, is a bisphenol A-epichlorohydrin type epoxy resin available from the Furane Products Company of Los Angeles, Calif. It is formulated for use in encapsulating semiconductor devices. Furane 89303 epoxy, Part B, is an anhydride curing agent or hardener also available from the Furane Products Company. Other types of two part epoxy or polyester resins may also be used to achieve the desired results within the scope of the invention. Equivalent materials are available from companies such as Hysol, Amicon, and Reichold Chemical.

The malic acid and Part A of the epoxy were added to an aluminum pan. The mixture was heated to about 150° C. with stirring, until the solution became clear. The solution was cooled to room temperature, Part B and the spheres of eutectic solder (63% tin, 37% lead) added to the pan, and the mixture stirred until uniform. A portion of the mixture was coated onto a polyimide circuit board containing a solder coated metallization pattern corresponding to the terminations of an integrated circuit. The polyimide board was heated to a temperature in excess of 185° C. to insure reflow of the solder spheres. After about 30 seconds, the polyimide circuit board was removed from the heat source and cooled to room temperature. The assembly was examined under a 30X microscope to verify solder reflow and wetting of the spheres to the polyimide circuit board and also to the integrated circuit.

EXAMPLE 2

A solution of 20 weight % malic acid in methanol was sprayed on a printed circuit board contaning a copper coated metallization pattern, and allowed to dry. The printed circuit board was heated to about 145° C. and a film of unsupported adhesive was placed on the printed circuit board, covering the metallization pattern. The adhesive was an epoxy film made from bisphenol-A and epichlorohydrin, filled with solder spheres. The adhesive is sold by Sheldahl, Inc., under the trademarked name of Z-Link ®, and is described in U.S. Pat. No. 4,747,968. The malic acid solution was sprayed on the adhesive, dried, and an integrated circuit was placed face down on the adhesive. The electrical terminations of the integrated circuit were aligned with the pads on the circuit board metallization pattern, and the printed circuit board was heated to in excess of 190° C. for about 30 seconds, while maintaining about 50 kg/cm$^2$ of pressure on the integrated circuit and printed circuit board assembly. After the printed circuit board and the integrated circuit were bonded, the assembly was removed from heat, cooled to room temperature, and examined under a 30×microscope to verify solder reflow and metallurgical wetting of the spheres to the printed circuit board and the integrated circuit.

An anisotropicaly conducting adhesive with fluxing properties can be used to reflow solder and encapsulate, and passivate surface mounted components, and flip chip integrated circuits in particular, while providing environmental protection of the active surface of the integrated circuit.

What is claimed is:

1. An adhesive having a fluxing agent and metal particles for use in reflow soldering and interconnecting an electrical component and a substrate, comprising;
   a thermoset resin,
   a fluxing agent,
   a curing agent, and
   metal particles, said metal particles melting to form a metallurgical bond to the electrical component and the substrate during the reflow soldering, and said adhesive having the property of being anisotropically conductive after the reflow.

2. The adhesive of claim 1 wherein the thermoset resin is epoxy or polyester.

3. The adhesive of claim 1, wherein the fluxing agent comprises a compound having the formula:

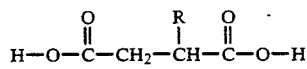

where R is an electron withdrawing group.

4. The fluxing agent of claim 3, wherein R is selected from the group consisting of fluorine, chlorine, bromine, iodine, sulfur, hydroxyl, nitrile, and benzyl.

5. The adhesive of claim 1, wherein the fluxing agent is malic acid.

6. The adhesive of claim 1, wherein the proportion of the fluxing agent in the adhesive ranges from about 0.1 to about 16 weight % of the adhesive.

7. The adhesive of claim 1, wherein the metal is selected from the group consisting of lead, tin, indium, bismuth, antimony, and silver.

8. The adhesive of claim 7, wherein the metal particles are an alloy of solder.

9. The adhesive of claim 1, wherein the size of the metal particles is greater than 1 micron but less than 20 microns.

10. The adhesive of claim 1, wherein the proportion of the metal particles is greater than 50 but less than 85 weight % of the adhesive.

11. An electrical component assembly, comprising:
    an electrical component having a plurality of electrical terminations;
    a component carrying substrate having a plurality of electrical terminations corresponding to the terminations of the electrical component; and
    an anisotropically conductive adhesive material for connecting the electrical component to the substrate, comprising;
    an epoxy resin,
    a fluxing agent,
    a curing agent, and
    solder particles reflowed to form a metallurgical bond between and electrically connecting the electrical component and the substrate, said anisotropic adhesive material being disposed between and bonding the electrical component and the substrate, and having different conductivity in different directions.

12. The adhesive material of claim 11, wherein the fluxing agent comprises a compound having the formula:

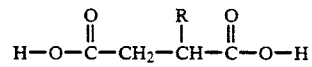

where R is an electron withdrawing group.

13. The fluxing agent of claim 12, wherein R is selected from the group consisting of fluorine, chlorine, bromine, iodine, sulfur, hydroxyl, nitrile, and benzyl.

14. The fluxing agent of claim 12, wherein the compound is malic acid.

15. The adhesive material of claim 11, wherein the proportion of the fluxing agent in the adhesive ranges from about 0.1 to about 16 weight % of the adhesive material.

16. The adhesive of claim 11, wherein the solder is selected from the group consisting of lead, tin, indium, bismuth, antimony, silver, and alloys thereof.

17. The adhesive of claim 11, wherein the size of the solder particles is greater than 1 micron but less than 20 microns.

18. The adhesive of claim 11, wherein the proportion of the solder particles is greater than 50 but less than 85 weight % of the adhesive.

19. The electrical component assembly of claim 11, wherein the component is an integrated circuit.

* * * * *